United States Patent [19]

Podkowa et al.

[11] Patent Number: 4,959,646
[45] Date of Patent: Sep. 25, 1990

[54] DYNAMIC PLA TIMING CIRCUIT

[75] Inventors: William J. Podkowa; Clark R. Williams, both of Plano, Tex.

[73] Assignee: Dallas Semiconductor Corporation, Dallas, Tex.

[21] Appl. No.: 208,891

[22] Filed: Jun. 17, 1988

[51] Int. Cl.[5] .............................................. H04Q 1/00
[52] U.S. Cl. .......................... 340/825.83; 340/825.87; 307/465
[58] Field of Search ...................... 340/825.83, 825.87; 307/465, 468, 469, 594, 601, 481; 365/94, 104, 190, 203; 364/716

[56] References Cited

U.S. PATENT DOCUMENTS

| | | | |
|---|---|---|---|
| 4,233,667 | 11/1980 | Devine et al. | 307/465 |
| 4,611,133 | 9/1986 | Peterson et al. | 307/465 |
| 4,636,661 | 1/1987 | Mahmud. | |
| 4,697,105 | 9/1987 | Moy | 307/465 |
| 4,740,721 | 4/1988 | Chung et al. | 340/825.83 |
| 4,769,562 | 9/1988 | Ghisio | 307/469 |
| 4,794,570 | 12/1988 | Rose et al. | 365/203 |

Primary Examiner—Donald J. Yusko
Assistant Examiner—Edwin C. Holloway, III
Attorney, Agent, or Firm—Worsham, Forsythe, Sampels & Wooldridge

[57]  ABSTRACT

A dynamic PLA timing circuit in a PLA ROM includes a first PLA line and the address section only of another PLA line. The address section of the first PLA line is connected to the true address lines and the address section of the other PLA line is connected to the complementary address lines. Shorting bars connecting the two PLA lines are formed around each pair of true and complementary address lines such that a conductive path is formed through the address sections for any address into the ROM. The data section is connected to the gates of every data transistor. However, the drains of all but one of the data transistors are not connected to their associated data line. The data line that is connected to the associated data transistor forms the output terminal of the timing circuit.

4 Claims, 4 Drawing Sheets

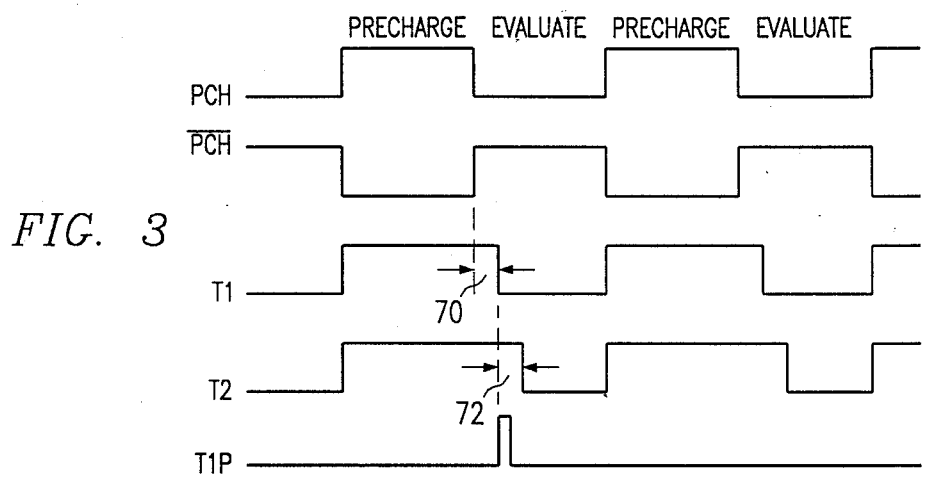
FIG. 3
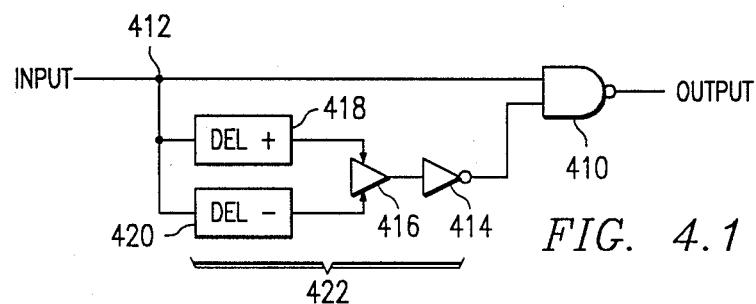
FIG. 4.1
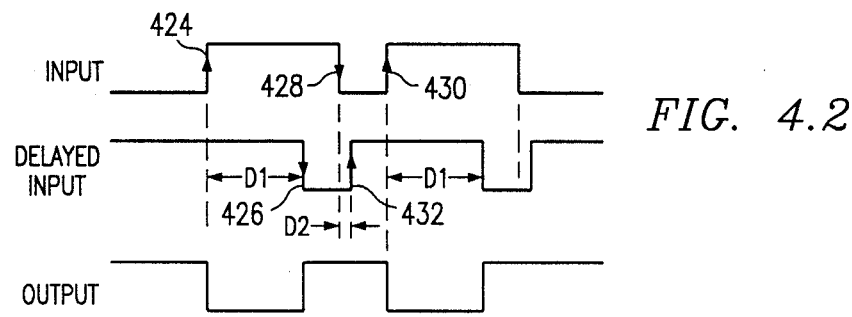
FIG. 4.2
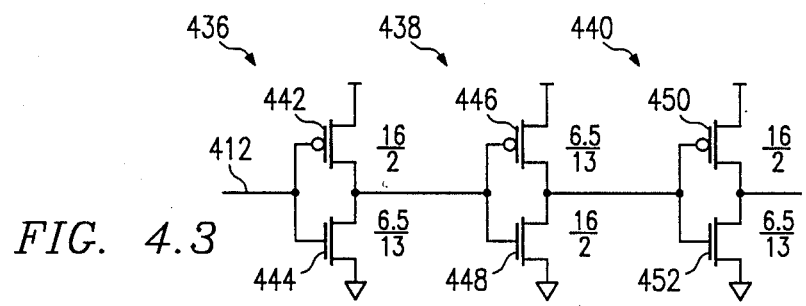
FIG. 4.3

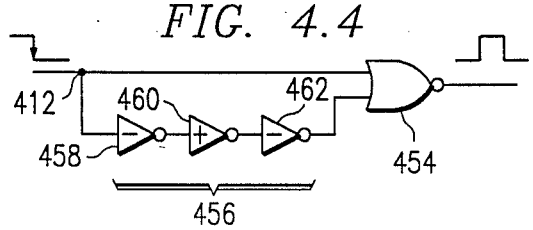
FIG. 4.4
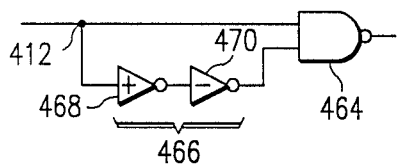
FIG. 4.5
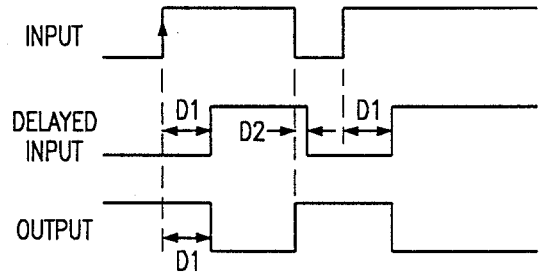
FIG. 4.6
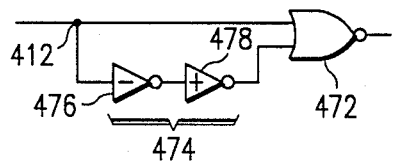
FIG. 4.7
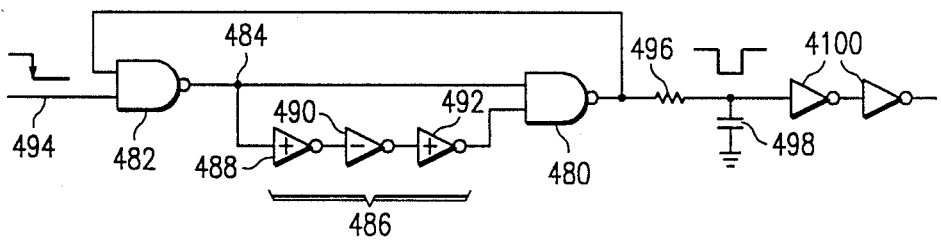
FIG. 4.8
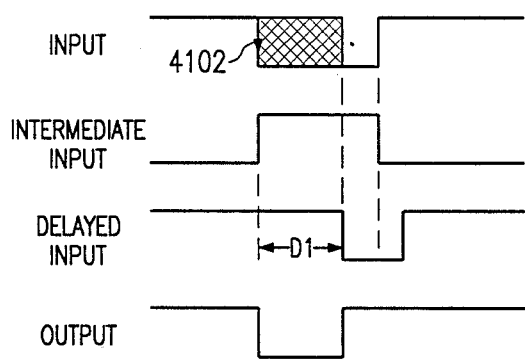
FIG. 4.9

DYNAMIC PLA TIMING CIRCUIT

REFERENCE TO RELATED APPLICATIONS

Reference is made to a first related application entitled "DYNAMIC CMOS BUFFER FOR LOW CURRENT SWITCHING", Ser. No. 208,287 filed june 17, 1988 in the name of Podkowa, William J. and Williams, Clark R. and to a second related application entitled DELAY CIRCUIT PROVIDING SEPARATE POSITIVE AND NEGATIVE GOING EDGE DELAYS, Ser. No. 208,288 filed June 17, 1988 and now abandoned in the names of Podkowa, William J. and Williams, Clark R. These applications disclose and claim a CMOS buffer for use with a low slew rate input signal and a one shot circuit respectively which are used in the preferred embodiment of the present invention.

TECHNICAL FIELD

The present invention relates to timing circuits, and more particularly, to dynamic PLA timing circuits.

BACKGROUND OF THE INVENTION

Dynamic PLA read-only memories include a matrix of PLA lines and address/data lines. For example, the PLA lines may be laid out in rows with the address and data lines forming columns of the matrix. The PLA operates by precharging the PLA lines and the data lines in a precharge operation, which is then followed by an evaluate operation in which the PLA lines enabled by the present address provide a logic 1 level, in the data section of the memory, which operates to discharge the data lines coupled to the enabled PLA lines by n-channel pull down transistors. Thus, the selected data lines, which were precharged to a logic 1 level, are pulled to ground potential by the selected PLA lines. After the data lines have stabilized, the logic level on the data lines is captured in a latch.

A critical timing operation is the latching of the state of the data lines. The state of the data lines does not change immediately when the evaluation operation begins due to the capacitance on the PLA lines and the data lines. Also, due to leakage, the non-selected data lines will eventually lose their charge and become a logic 0 level even though not selected in the current read operation. Therefore, the logic state of the data lines must be captured in a latch within an appropriate time window after the evaluate operation begins.

This delay time, between the start of the evaluation cycle and the time window when the correct data is on the data lines, is a function of the manufacturing process and may vary from manufacturing lot to manufacturing lot. Also, in certain systems, an appropriate external clock pulse, which is normally used to provide this timed delay, is not readily available.

Therefore, it can be appreciated that a dynamic PLA timing circuit which compensates for manufacturing process variations and which does not require an external clock is highly desirable.

SUMMARY OF THE INVENTION

It is therefore an object of this invention to provide a dynamic PLA timing circuit which compensates for variations in the manufacturing process and which does not require an external clock signal.

Shown in an illustrated embodiment of the invention is a timing apparatus for use with a memory device which includes PLA line having a series combination of a precharge transistor, an address section, and a data section, the data section being connected to the control terminal of a switching device coupled to a data line, the data line forming the output of the timing apparatus. The timing apparatus also includes at least one additional address section of a PLA line and also includes shorting strips connected from various portions of the address section of the PLA line to the corresponding places on the at least one additional address section such that the PLA line is conductive from the precharging transistor to the data line for any address into the memory device.

BRIEF DESCRIPTION OF THE DRAWINGS

The aforementioned and other features, characteristics, advantages, and the invention in general, will be better understood from the following, more detailed description taken in conjunction with the accompanying drawings in which:

FIG. 3 is a timing diagram showing the timing relationship of various signals in FIG. 1 and FIG. 2.

FIG. 4.1 illustrates a logic diagram of a pulse generator circuit having a delay circuit that is a function of the direction of the transition between a logic "1" and a logic "0;

FIG. 4.2 illustrates a timing diagram for the circuit of FIG. 4.1;

FIG. 4.3 illustrates a detailed schematic of the delay circuit utilized in FIG. 4.1;

FIG. 4.4 illustrates a logic diagram of the pulse generator circuit utilizing a NOR gate;

FIG. 4.5 illustrates a logic diagram of a gate circuit utilizing the delay of the present invention;

FIG. 4.6 illustrates a timing diagram for the logic circuit of FIG. 4.5;

FIG. 4.7 illustrates the gate circuit of FIG. 4.5 utilizing a NOR gate;

FIG. 4.8 illustrates a logic diagram of a one shot circuit; and

FIG. 4.9 illustrates a timing diagram for the circuit of FIG. 4.8.

Figure 1:
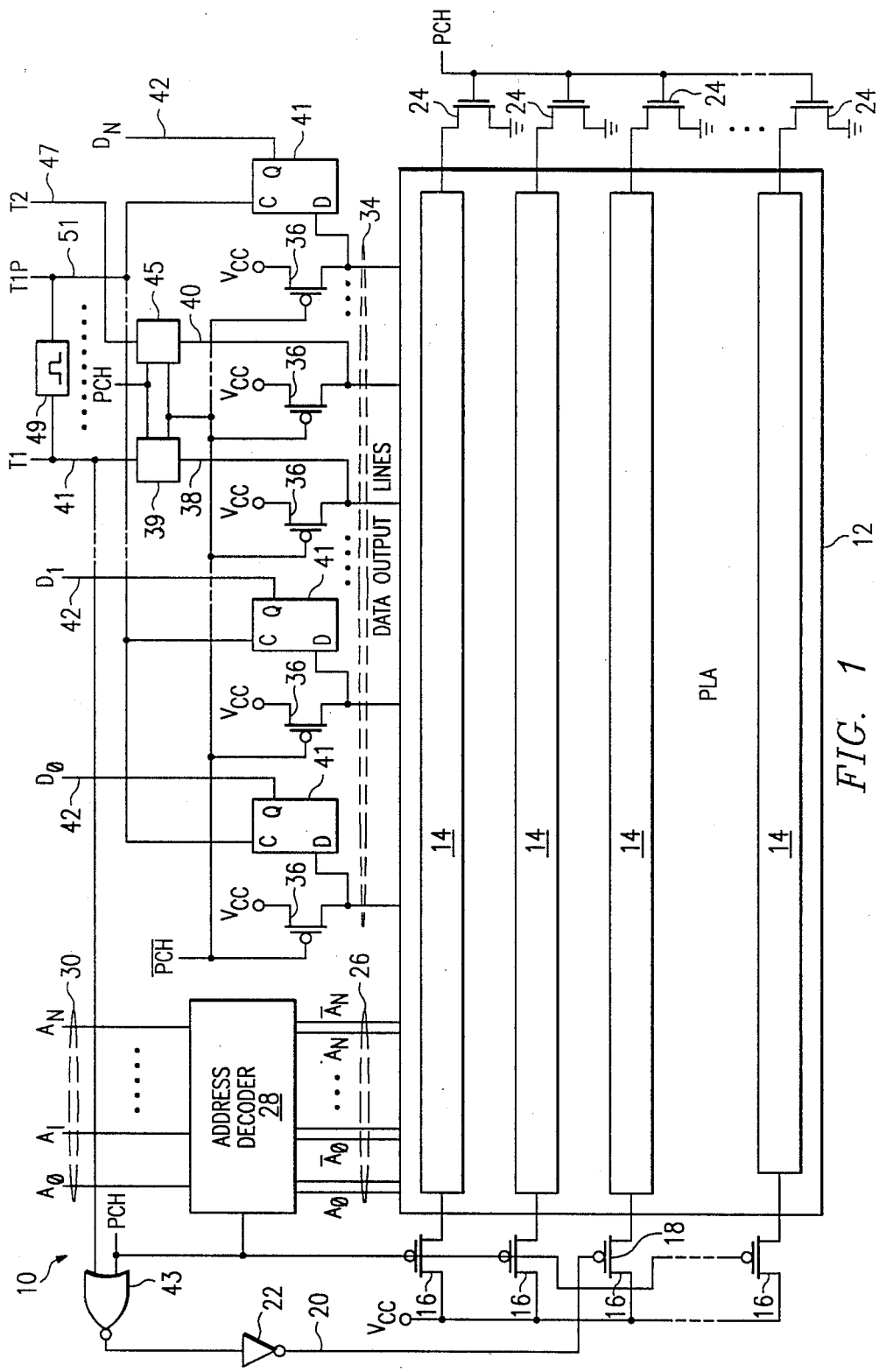
FIG. 1 is a block diagram of a dynamic PLA ROM containing a timing circuit according to the present invention.

It will be appreciated that for purposes of clarity and where deemed appropriate reference numerals have been repeated in the figures to indicate corresponding features, and that the pulse times shown in FIG. 3 have not necessarily been drawn to scale in order to more clearly show timing relationships in the preferred embodiment of the present invention.

DESCRIPTION OF THE PREFERRED EMBODIMENT

The dynamic PLA timing circuit in the preferred embodiment is used in a dynamic PLA ROM. The timing circuit includes a first (timing) PLA line including address and data portions, and a second (truncated) PLA line including an address portion, each pair of true and complementary address lines $A_O/A_O$-bar through $A_N/A_N$-bar, one makes contact to the address portion of the first PLA line, and the other of each pair of true and complementary address lines makes contact to the address section of the second PLA line. In the data section of the PLA line contact is made with the gates of all of the data transistors associated with each of the data lines, but, significantly, the drain of all of these transistors, except one, is disconnected from its associated data line. The data line making contact with the drain of the transistor gated by the PLA line forms the output signal of the timing circuit. The address portion of the first PLA line and the address portion of the second PLA line are shorted together, so that one of these address portions is coupled to every one of the address lines $A_O$ through $A_N$-bar. Thus, for any address combination into the ROM, a conductive path is formed through the address portion of the combination of the first PLA line and the second truncated PLA line.

A read operation begins with a precharge cycle, in which a p-channel transistor coupled between the address section of the PLA lines and VCC is turned off or made nonconductive while an n-channel transistor connected to the data portion of the PLA lines is made conductive. This causes the PLA lines to be at ground potential. When the PLA ROM switches from the precharge mode to the evaluation mode, the n-channel transistor is first turned off and then the p-channel transistor is then turned on or made conductive which allows the addressed PLA line to begin charging toward VCC. The PLA lines have distributed capacitance associated with them (and each gate connection of the PLA lines adds additional distributed capacitance to the lines which slows down the charging of the PLA lines toward VCC. Since the timing PLA line in combination with the truncated PLA line have gate connections to all of the address lines and since the timing PLA line also has gate connections to each of the data line transistors, the PLA timing line has a capacitance greater than any of the other PLA lines in the array. The voltage potential on the timing PLA line or data line will, always lag the rising voltage on the other PLA lines. Thus, when the data line controlled by the timing PLA line switches from a logic 1 to a logic 0 condition, all of the other data lines will have stabilized by that time. Thus the output of this timing circuit is used to latch the data from the other data lines into their respective latch circuits.

Also, in the preferred embodiment of the invention, the output of a first timing PLA line is used to control the p-channel precharge transistor of a second timing PLA circuit to form a second time delay pulse which is delayed from the output of the first timing circuit by the same time delay as the first timing circuit.

Turning now to the drawings, FIG. 1 shows a dynamic PLA ROM 10 which includes timing circuitry according to the present invention. The PLA ROM 10 includes a PLA array 12 which, in the preferred embodiment, has PLA lines 14 arranged as rows in the PLA array 12. Each of the PLA lines 14 is coupled to VCC through the drain and source terminals of a p-channel precharge transistor 16. Each of the p-channel precharge transistors 16 except one, shown as 18 in FIG. 1, has its gate connected to a precharge signal PCH. The precharge transistor 18 has its gate connected to a signal line 20 which is connected to the output of an inverter 22. The other end of each of the PLA lines 14 is connected to the drain of an n-channel precharge transistor 24. The sources of the n-channel precharge transistors 24 are connected to ground and the gates are connected to the precharge signal PCH.

The columns of the PLA array 12 are divided into two sections, the first being an address section having address column lines 26 which are driven by an address decoder circuit 28. The address decoder circuit 28 receives address inputs on the address lines 30 and provides true and complementary address lines 26 for each of the input address lines 30. The address decode circuit 28 also receives the PCH precharge signal. The second section of the columns of the PLA array 12 are the data output lines 34, each of which is connected through a p-channel precharge transistor 36 to $V_{cc}$. The gates of the p-channel precharge transistors 36 are connected to a precharge signal $\overline{PCH}$. All of the data lines 34, except for the two data lines 38 and 40, are connected to the D input of a latch circuit 41. The Q outputs of the latches 41 form the data output lines 42 of the dynamic PLA ROM 10. The signals PCH and $\overline{PCH}$ are generated by circuitry not shown in the drawings but well known to those skilled in the art.

The data line 38 is connected to the input of a dynamic buffer circuit 39. The dynamic buffer circuit 39 in the preferred embodiment is described in the aforementioned patent application entitled "DYNAMIC CMOS BUFFER FOR LOW CURRENT SWITCHES" which is hereby incorporated by reference. The output of the dynamic buffer circuit 39 forms the T1 signal on line 44. Line 44 is connected to one input of a NOR gate 43, the output of which is connected to the input of the inverter 22. A second input of the NOR gate 43 is connected to PCH.

The T1 line 44 is also connected to the input of a one shot 49. The one shot 49 in the preferred embodiment is described in greater detail below. The one shot 49 is triggered by a falling edge on its input, and provides a positive pulse at its output. The output of the one shot 49 forms the T1 pulse on a line 51 which is connected to the clock inputs of each of the latch circuits 41.

The data line 40 is connected to another dynamic buffer circuit 45, the output of which forms the T2 signal on line 47.

Figure 2:
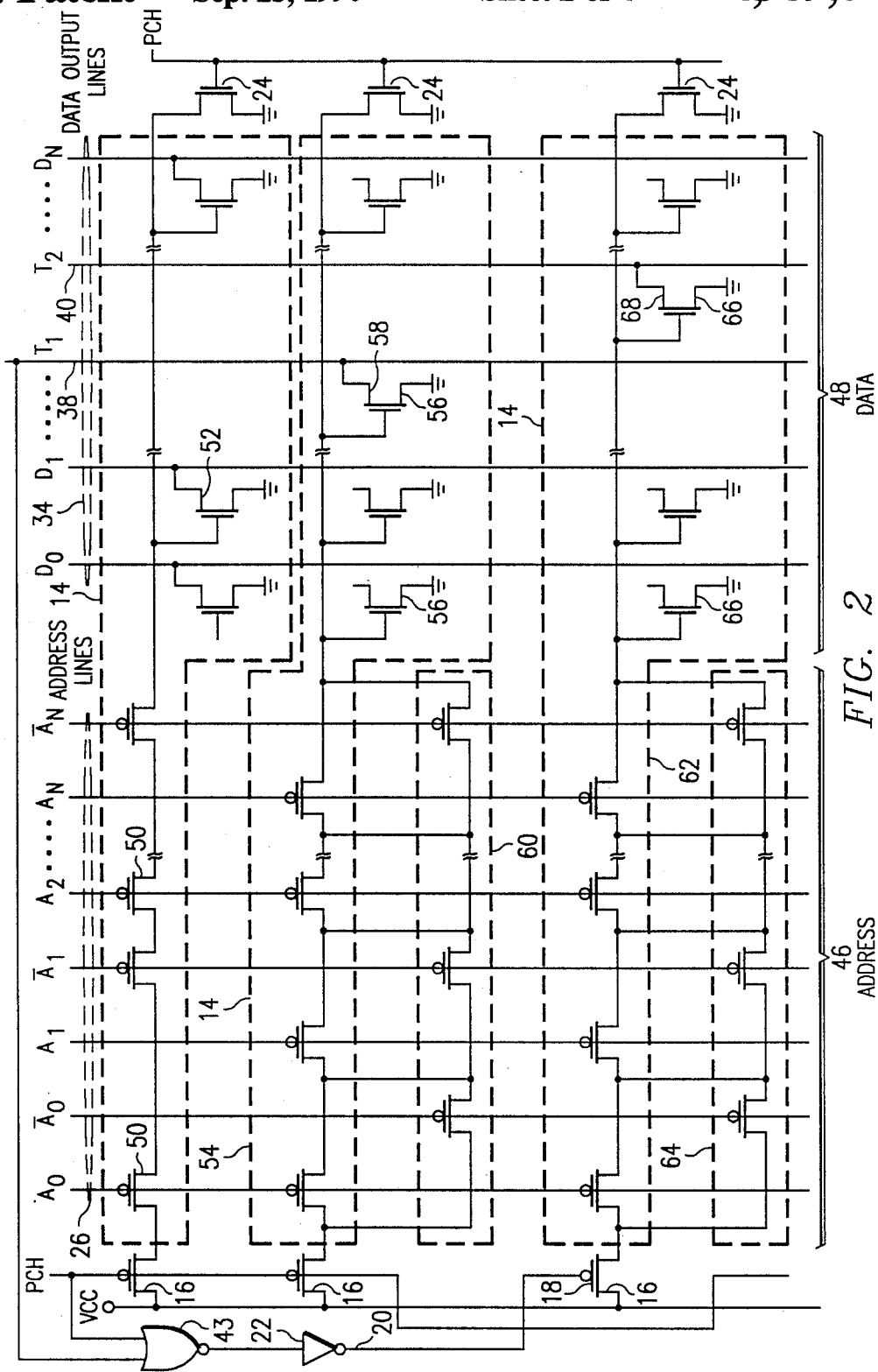
FIG. 2 is a schematic diagram of a portion of the PLA matrix showing a timing circuit according to the present invention.

FIG. 2 is a schematic diagram of a portion of the PLA array 12. The top PLA line 14 in FIG. 2 is a standard PLA ROM line which has an address section 46 and a data section 48. The ROM PLA line 14 address section 46 is comprised of a series connection of p-channel transistors 50 which are connected to selected address lines 26. The data section 48 of the ROM PLA line 14 is connected to the control terminals or gates of selected data transistors 52 which have their drains connected to their associated data lines 34 and their sources connected to ground.

Also shown in FIG. 2 are two timing circuits. The first timing circuit includes a PLA timing line 54 which has connections to each of the true address lines in the address section 46 and which has connections to the gates of each of the data line transistors 56. All except one of the data line transistors 56 does not have a connection between its drain and its associated data line 34. The one exception is the data line transistor 58 which has its drain connected to the data line 38 which is coupled through the dynamic buffer circuit 39 to form the T1 timing signal. Connected in parallel with the PLA timing line 54 is a truncated second PLA line 60. The truncated PLA line 60 includes only the address portion 46 of the PLA line and makes connection to one of each pair of the complementary address lines 26. The address portion of the PLA line 54 and the truncated PLA line 60 are shorted together on either side of each pair of true and complementary address lines.

Similarly, a second timing circuit is composed of another PLA timing line 62 and a second truncated PLA line 64. The data section 48 of the truncated PLA line 62 is also connected to each gate of its associated data transistors 66, all of which except one have no connection between their drain and their associated data line 34. The one data line transistor 68 which is connected to the data line 40 which, in turn, is coupled through the dynamic buffer circuit 45 to form the T2 timing signal. The address sections of the PLA line, 62 and the truncated PLA line 64 are connected similarly to the address sections of the PLA line 54 and its associated truncated PLA line 60.

In operation, and with reference now to FIG. 3, the PLA ROM of the preferred embodiment begins with a precharge cycle in which the p-channel precharge transistor 16 are made nonconductive and the n-channel precharge transistors 24 are made conductive thereby pulling the data section 48 of the PLA lines to ground potential. At the same time, the address decode circuit 28 captures the data on the address line 30 and provides the true and complementary address pairs 26 into the address section 46 of the PLA array 12. Also at this time, the p-channel precharge transistors 36 connected to each of the data lines 34 are enabled to precharge each of the data lines 34 to $V_{cc}$.

When the complementary precharge signals PCH and $\overline{PCH}$ switch to the evaluate cycle of the ROM operation as shown in FIG. 3, then the p-channel precharge transistors 16 are enabled and the n-channel precharge transistors 24 are disabled. At the same time the p-channel precharge transistors 36 connected to the data lines are disabled, thereby isolating the VCC charge on the data lines 34. In the standard PLA ROM line 14, if the address lines 26 connected to the series address transistors 50 are all at a logic 0 level, then the VCC voltage will propagate down the address section of the PLA line 14 and cause the PLA line 14 in the data section 48 to go to VCC. The VCC voltage will enable each of the data transistors 52 connected to the PLA line 14 which will thereby discharge their associated data lines 34. If one of the address lines connected to the series p-channel transistors 50 in the address section 46 of the PLA ROM array 14 is not at a logic 0 level, then the VCC voltage will be blocked from the data section 48 of the PLA line 14, and the associated data transistors 52 will remain nonconductive and will not pull down their associated data lines 34.

The first timing circuit (including the PLA line 54 and the truncated PLA line 60 in conjunction with their shorting connections between each pair of true and complementary bit lines) forms a continuous conductive path between the precharge transistor 16 and the data section 48 of the PLA lines 54. Thus, when the PLA ROM enters its evaluate cycle, the VCC voltage will be applied to the data section 48 for any address into the ROM on the address lines 30. However, the data section 48 of the PLA line 54 will not rise instantaneously, but will rise at a rate determined by the capacitance on the PLA line 54 and the truncated PLA line 60. The magnitude of this capacitance is subject to process variations. Since the combination of PLA line 54 and truncated PLA line 60 makes contact to every address line 26 and has a contact to the gate of every data transistor 56, it therefore has more capacitance than the PLA ROM lines, irrespective of process variations. The voltage rising on the PLA line 54 will therefore rise more slowly than the voltage on any of the PLA ROM lines, and thus the data transistor 56 will be enabled later than any other data transistor 52 associated with the PLA ROM lines. Thus, the voltage on the data line 38 will switch from a logic 1 to a logic 0 level at a time when each of the other data lines 34 has stabilized at its voltage and before a time that the data lines 34 which have not been pulled down by a data line transistor will have leaked their charge and assumed a logic 0 voltage level. The falling edge of the signal on the data line 38 is coupled through the dynamic buffer circuit 39 to fire the one shot 49, the output of which latches the data from the other data lines into their respective latch circuits 41.

The signal on the data line 38 is NOR'd with the PCH signal and inverted by the inverter 22 to form the precharge signal at the gate of the p-channel precharge transistor 18 for the T2 data line. Thus, the p-channel precharge transistor 18 is held nonconductive until the T1 data signal falls to a logic 0 level which begins the timing circuit on the PLA line 62. The output of the second timing circuit is on the data line 40. This second timing signal T2 on line 47 is used for timing in other ratioless circuitry on the integrated circuit chip embodying the preferred embodiment of the present invention.

As shown in FIG. 3, the T1 delay time is shown as element 70 and the T2 time delay is shown as element 72.

Thus, there has been shown a dynamic PLA timing circuit which compensates for the manufacturing variations in the PLA ROM circuit and which is able to provide a timing circuit independent of an external clock to the PLA ROM.

Although the invention has been described in part by making detailed reference to a certain specific embodiment, such detail is intended to be, and will be understood to be, instructional rather than restrictive. It will be appreciated by those skilled in the art that many variations may be made in the structure and mode of operation without departing from the spirit and scope of the invention as disclosed in the teachings contained herein.

PREFERRED EMBODIMENT OF ONE-SHOT 49

Referring now to FIG. 4.1, there is illustrated a logic diagram of a pulse generation circuit utilizing the delay circuit of the preferred embodiment. The pulse generation circuit is configured utilizing a two-input NAND gate 410 having one input thereof connected to a signal input line 412 and the other input thereof connected to the output of an inverter 414. The inverter 414 has the input thereof connected to the output of a delay 416. Delay gate 416 is controlled by a positive edge delay circuit 418 and a negative edge delay circuit 420. The positive edge delay circuit 418 is operable to determine when a transition from a logic low to a logic high occurs on input node 412 and delay this transition by a predetermined amount of delay for input to the inverter 414. In a similar manner, the negative edge delay circuit 420 is operable to sense the occurrence of a negative edge transition from a logic high to a logic low on the input node and delay this transition by a predetermined amount of delay for input to the inverter 414. The delay provided by the positive edge delay circuit 418 and the negative edge delay circuit 420 are different. In general, the inverter 414, the gate 416 and the positive edge delay circuit 418 and negative edge delay circuit 420 are referred to as a delay circuit 422.

Referring now to FIG. 4.2, there are illustrated timing diagrams for the operation of the circuit of FIG. 4.1. Initially, the input signal is at a logic low and then makes a transition to a logic high signal, resulting in a positive transition 424. This is input directly to one input of the NAND gate 410. The other input is a delayed input which has a negative going edge 426 that occurs after a delay D1. During this period of time between the occurrence of a positive going edge 424 of the input signal and the negative going edge 426 of the delayed signal, both inputs of the NAND gate 410 are at a logic "1", resulting in a logic "0" on the output thereof. Therefore, the width of the pulse output is equal to the delay D1. The pulse is a negative going pulse and will only be generated after the occurrence of a positive going edge. Until another positive going edge occurs, the output of the NAND gate 410 will remain at a logic high. Of course, if the input signal goes low before the occurrence of the negative going edge 426, the pulse width of the negative going pulse on the output of NAND gate 410 will be shortened.

In order to generate another negative going output pulse from NAND gate 410, it is necessary to generate another positive going edge. This will require the input signal to make a transition from a logic high to a logic low and then back to the logic high. This is represented by a negative going edge 428 on the input signal followed by a positive going edge 420 on the input signal. When the negative edge 428 occurs, this edge is delayed by a delay D2 to bring the delayed input back to a logic "1" with a positive going edge 432. It is necessary to the delayed input to be at a logic "1" level before the occurrence of the next positive going edge 430 on the input signal. As can be seen from FIG. 4.2, the delay D2 is significantly smaller than the delay D1, thereby allowing the positive edge 430 to occur in less time than a duration of time equal to the delay D1. This is achieved by utilizing an asymmetrical delay circuit which provides a first delay for a positive going edge and a second delay for a negative going edge.

Referring now to FIG. 4.3, there is illustrated a detailed schematic diagram of the delay circuit 422 of FIG. 4.1. The delay circuit 422 of FIG. 4.1 utilizes three CMOS inverter circuits 436, 438 and 440, connected in a series fashion 436–440 is operable to provide an internal delay therefor. However, each of the inverters 436–440 differs from conventional inverters in that the delay to a positive going edge and the delay associated with a negative going edge are different. The first inverter 436 is comprised of a P-channel transistor 442 and an N-channel transistor 444 connected in a complementary fashion. The P-channel transistor 442 has the source thereof connected to VCC, the drain thereof connected to an output of the inverter 436 and the gate thereof connected to an input of the inverter 436 on input line 412. The N-channel transistor 444 has the source thereof connected to ground, the drain thereof connected to the output node of the inverter and the gate thereof connected to the input node. This is a conventional complementary configuration for MOS transistors.

The delay provided by the inverter is a function of the series resistance and associated node capacitance of each of the P-channel transistor 442 and the N-channel transistor 444 operating individually. In one mode, current is drawn from the supply VCC through the P-channel transistor 442 for charging the output node capacitance, which capacitance is generally comprised of the gate capacitance of the next inverter that is driven by the output. In a second mode, current is drawn from the output node to ground through N-channel transistor 444 to discharge the capacitance. As the series resistance of the P- and N-channel transistors vary, the delay through the inverter also varies.

The series resistance through either the P-channel transistor 442 or the N-channel transistor 44 is a function of the size of the transistor. The size of the transistor is typically referred to as the width to length ratio (W/L) of the transistor. In the present embodiment, a longer delay is desired for D1 with respect to the positive going edge and a shorter delay is desired for a negative going edge. For the positive going edge, the transistor that is turned on should have a relatively long delay. For the negative going edge, the switching of the inverter in that mode should have a relatively short delay. With respect to the first inverter 436, the N-channel transistor 414 is turned on for a positive going edge and, therefore, has a low W/L ratio of 6.5/13. The P-channel transistor 442 is turned on with a negative going edge and has a lower resistance corresponding to a high W/L ratio of 16/2.

Since the delay of the overall delay circuit 422 is a function of the accumulated delay in each of the inverters 436–440, each of the inverters 438 and 440 are configured similar to inverter 436. Inverter 438 is comprised of a P-channel transistor 446 and an N-channel transistor 448 configured as complementary devices and inverter 440 is comprised of a P-channel transistor 450 and an N-channel transistor 452 configured as complementary devices. The inverter 440 is identical to the inverter 436 but inverter 438 is different in that the W/L ratio of P-channel transistor 446 is 6.5/13 and the W/L ratio of N-channel transistor 448 is 16/2, the opposite of the W/L ratios for inverter 436 and inverter 440. In this manner, N-channel transistor 44, which is turned on for positive going edge results in the turn on of P-channel transistor 446 in inverter 438. Since a long delay is required for a positive going edge, N-channel transistor 444, P-channel transistor 446 and N-channel transistor 452 must have the longer delay associated therewith since these are the transistors that provide a current path to charge or discharge a particular capacitive node. By alternating the long and short delay between the P-channel and N-channel transistors in each inverter in a series of inverters, the positive edge of an input pulse can be delayed with a first delay whereas the negative going edge of the input pulse can be delayed with a second and different delay.

Referring now to FIG. 4.4, there is illustrated a logic diagram of a pulse generator utilizing a two-input NOR gate 454. The NOR gate 454 has one input thereof connected to the input line 412 and the other input thereof connected to the output of a delay circuit 456. The delay circuit 456 is comprised of three inverters 458, 460 and 462 configured in a series configuration. The first inverter in the chain is the inverter 458, the second inverter is the inverter 460, and the third inverter is the inverter 462. Inverters 458–462 each provide asymmetric delays to positive and negative going pulses. The inverters are marked with a "+" or "−", wherein the "+" indicates the longest delay for the leading edge and the "−" indicates the longest delay inverters for the falling edge. The inverters 458–462 comprise the longest delay for the falling edge and the inverter 460 provides the longest delay for the rising edge. Therefore, the circuit of FIG. 4.4 is operable to provide the longest delay for the input signal having a falling edge. This results in a positive going pulse on the output which has a pulse width equal to the sum of the longest delays in the inverters 458-462. As was the case with the circuit of FIGS. 4.1 through 4.3, the delayed input to the NOR gate 454 recovers at a faster rate when the input has a rising edge thereon due to the smaller accumulated delay of the inverters 458-462 in response to the rising edge.

Referring now to FIG. 4.5, there is illustrated a logic diagram of a two-input NAND gate 464 having one input thereof connected to the input node 412 and one input thereof connected through a delay circuit 466 to the input node 412. The delay circuit 466 is comprised of an even number of inverters, in this case two inverters 468 and 470. Inverter 468 is the first inverter in the chain and inverter 470 is the second inverter in the chain. The first inverter 468 is labelled with a "+" and the second inverter 470 is labelled with a "−". Therefore, a rising edge on the input node 412 provides the longest delay.

Referring now to FIG. 4.6, there is illustrated a timing diagram for the circuit of FIG. 4.5. When a rising edge occurs on the input and the logic state changes from a logic low to a logic high, the delayed input changes from a logic low to a logic high after a delay D1. The output of the NAND gate 464 is normally a logic high and goes to a logic low when the delayed input goes to a logic high after the delay D1. When the input goes to a logic low, the output goes to a logic high. However, the delayed input goes from a logic low to a logic high after only a delay D2 from the falling edge of the input signal. This allows the input to again go from a logic low to a logic high in a much shorter time. If the delay D2 were not shorter than D1, the input would be required to remain at a logic low for the duration of D2. By making D2 smaller than D1, the rising edge of the input signal can occur very shortly after the falling edge thereof.

Referring now to FIG. 4.7, there is illustrated an alternate embodiment of the present invention utilizing a two-input NOR gate 472 having one input thereof connected to the input node 412 and the other input node 412. The delay circuit 474 is comprised of an even number of circuits in this example, two inverters 476 and 478. Inverter 476 is the first inverter in chain. The first inverter 476 is labelled with a "−" and the second inverter 478 is labelled with a "+". Therefore, the inverter 472 operates on a falling edge with the longest delay resulting in a negative going signal that occurs after a delay D1 from the falling edge of the input signal 412.

Referring now to FIG. 4.8, there is illustrated a logic diagram of a one shot circuit utilizing the delay circuit of the preferred embodiment. A two-input NAND gate 480 has one input thereof connected to the output of a two-input NAND gate 482 at a node 484. A delay circuit 486 is connected between the node 484 and the other input of the NAND gate 480. The delay circuit 486 is comprised of three inverters 488, 490 and 492. Inverter 488 is labelled with a "+" sign, inverter 490 is labelled with a "−" sign and inverter 492 is labelled with a "+" sign. Therefore, inverters 488 and 492 provide the longest delay with respect to a rising edge and inverter 490 provides the longest delay with respect to a negative going edge. NAND gate 482 has one input thereof connected to the output of NAND gate 480 and the other input thereof connected to an input node 494 for receiving an input signal. The output of NAND gate 480 is connected through a delay circuit configured of a series resistor 496 and a shunt capacitor 498 to provide a low pass filter function, the output of which is connected through two series connected inverters 4100, acting as a buffer, to provide an output.

The operation of the circuit of FIG. 4.8 is illustrated with respect to timing diagrams of FIG. 4.9. When the input signal goes from a logic high to a logic low on a falling edge 4102, the output of NAND gate 482 provides an intermediate input to NAND gate 480 which intermediate input goes from a logic low to a logic high. In addition, the delayed input to NAND gate 480 goes from a logic high to a logic low after a delay D1. Therefore, the delayed input remains high during the delay D1 such that the output of NAND gate 480 goes low for duration D1. Since the output of NAND gate 480 is connected to the other input of NAND gate 482, the low logic state latches a logic high on the output of NAND gate 482. Therefore, during the delay D1 and the time that the output of NAND gate 480 is low, any spurious transients on the input node 494 will not retrigger the delay circuit 486 nor shorten the pulse width. In this manner, the delay circuit 486 is therefore protected, resulting in a pulse width that is truly edge triggered.

What is claimed is:

1. A timing circuit for use with a dynamic PLA, said PLA having a plurality of pairs of true and complementary address lines and a plurality of data lines, said timing circuit comprising:
a first PLA line, including an address portion and a data portion
having connections to one of said true and complementary address lines of each of said plurality of pairs of true and complementary address lines and also
having connections to the gates of a plurality of transistors,
each of said plurality of transistors being associated with one of said plurality of data lines,
wherein all except one of said plurality of transistors is not connected to pull its corresponding data line to ground potential for any logic level gate voltage applied to said all except one of said second plurality of transitors;
a second address portion of a second PLA line having connections to the other of said true and complementary address lines of each of said plurality of pairs of true and complementary address lines; and
conductive means for shorting between said first PLA line and said second address portion on both sides of each pair of said pairs of true and complementary address lines.

2. Timing apparatus for use in a memory device comprising:
a first dynamic PLA line having a series combination of a precharge transistor, a first address portion, and a data portion,
said data portion being connected to the gate of at least one data line transistor, said data line forming the output of said timing apparatus;
at least one additional address portion of at least one additional dynamic PLA line; and
conduction means for shorting between said first address portion of said PLA line and said at least one additional address portion such that said PLA line in combination with said at least one additional address portion forms a conductive path from said precharge transistor to said data portion for any address provided to said memory device.

3. The timing apparatus of claim 2, wherein said data section of said first PLA line forms connections to the control terminals of a second plurality of additional data transistors, said additional data transistors not being connected to change the logic state on its associated data lines for any logic 1 level or logic 0 level voltage applied to said control terminals.

4. The timing apparatus of claim 2 including both a first and a second timing apparatus according to claim 2 wherein said precharge transistor of said second timing apparatus has its gate coupled to the output terminal of said first timing apparatus.

* * * * *